(12) United States Patent
Matsushita (10) Patent No.: US 10,790,605 B2
(45) Date of Patent: Sep. 29, 2020

(54) FEMALE TERMINAL, AND CONTINUITY TEST DEVICE

(71) Applicant: Yazaki Corporation, Minato-ku, Tokyo (JP)

(72) Inventor: Kouichirou Matsushita, Makinohara (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 50 days.

(21) Appl. No.: 16/171,772

(22) Filed: Oct. 26, 2018

(65) Prior Publication Data

US 2019/0140381 A1 May 9, 2019

(30) Foreign Application Priority Data

Nov. 7, 2017 (JP) .................... 2017-214422

(51) Int. Cl.
*G01R 31/04* (2006.01)
*H01R 13/11* (2006.01)
(Continued)

(52) U.S. Cl.
CPC ............ *H01R 13/111* (2013.01); *G01R 31/50* (2020.01); *G01R 31/69* (2020.01); *H01R 13/506* (2013.01);
(Continued)

(58) Field of Classification Search
CPC .... G01R 31/026; G01R 31/045; G01R 31/26; G01R 31/0466; G01R 31/06716; G01R 31/06738; G01R 31/2601; G01R 31/2863; H01R 13/111; H01R 13/4362; H01R 13/506; H01R 13/7034; H01R 13/03;
(Continued)

(56) References Cited

U.S. PATENT DOCUMENTS 5,658,172 A * 8/1997 Schmidt .............. H01R 9/2491
439/716
7,666,037 B2 * 2/2010 Diessel ............... H01R 9/2616
439/716
(Continued)

FOREIGN PATENT DOCUMENTS

JP 2000-284014 A 10/2000
JP 2000284014 * 10/2000
(Continued)

*Primary Examiner* — Thang X Le
(74) *Attorney, Agent, or Firm* — Banner & Witcoff, Ltd.

(57) ABSTRACT

There is provided a female terminal and a continuity test device. The female terminal has a pair of continuity test contacts protruded so as to be brought into contact with a continuity test pin in a position closer to the entrance side of a cylindrical part where the connection portion is inserted, in the direction of insertion of a connection portion, than a contact, with the connection portion, of an elastic contact piece provided on an inner surface of the cylindrical part. The female terminal sandwiches the connection portion between the elastic contact piece and an inner surface facing another inner surface of the cylindrical part. The pair of continuity test contacts are protruded on inner surfaces of the cylindrical part facing in the direction orthogonal to the direction of sandwiching of the connection portion by the elastic contact piece.

3 Claims, 9 Drawing Sheets

(51) Int. Cl.
*G01R 31/50* (2020.01)
*G01R 31/69* (2020.01)
*H01R 13/506* (2006.01)
*H01R 13/436* (2006.01)

(52) U.S. Cl.
CPC ...... *H01R 13/4362* (2013.01); *H01R 2201/20* (2013.01)

(58) Field of Classification Search
CPC  H01R 13/7033; H01R 9/2633; H01R 9/2666; H01R 9/2616; H01R 9/2491
See application file for complete search history.

(56) References Cited

U.S. PATENT DOCUMENTS

| | | | |
|---|---|---|---|
| 2010/0197177 A1* | 8/2010 | Myer | H01R 13/113 |
| | | | 439/852 |
| 2010/0197178 A1* | 8/2010 | Hotea | H01R 13/187 |
| | | | 439/852 |
| 2013/0023163 A1* | 1/2013 | Glick | H01R 13/426 |
| | | | 439/752 |
| 2015/0050838 A1* | 2/2015 | Copper | H01R 13/114 |
| | | | 439/626 |
| 2017/0237191 A1 | 8/2017 | Endo et al. | |

FOREIGN PATENT DOCUMENTS

| | | |
|---|---|---|
| JP | 2004-037164 A | 2/2004 |
| JP | 2017-004651 A | 1/2017 |
| JP | 2017-147095 A | 8/2017 |

* cited by examiner

FEMALE TERMINAL, AND CONTINUITY TEST DEVICE

CROSS-REFERENCES TO RELATED APPLICATIONS

This application is a based on and claims priority from Japanese Patent Applications No. 2017-214422 filed on Nov. 7, 2017, the entire contest of which are incorporated herein by reference.

BACKGROUND OF THE INVENTION

Technical Field

The present invention relates to a female terminal connected to a male terminal by a contact of an elastic contact piece, and a continuity test device.

Background Art

Conventionally, a continuity test of a connector incorporating a female terminal is performed by connecting a continuity test pin to the contact of the female terminal accommodated in a connector housing.

For example, the female terminal is designed to be connected to a male terminal by the contact of an elastic contact piece provided on an inner surface of a cylindrical part where the connection portion of the male terminal is inserted, so as to sandwich the connection portion between the elastic contact piece and an inner surface facing the inner surface.

When the continuity test of such a female terminal is performed, the continuity test pin is brought into contact with the elastic contact piece. For this reason, if the range of use of the elastic contact piece is the plastic zone, a problem of reduction in spring load and a problem of adhesion of foreign substances to the contact of the elastic contact piece can arise.

To solve such a problem, for example, Patent Document 1 describes a continuity test device designed to perform the continuity test by electrically connecting the continuity test pin and the female terminal through a conductive gel injected from the continuity test pin without the continuity test pin being in contact with the elastic contact piece.

Patent Document 1: JP-A-2017-4651 A

SUMMARY OF THE INVENTION

However, the continuity test device described in Patent Document 1 has a problem in that it is necessary to inject the conductive gel from the continuity test pin and this complicates the structure of the continuity test device.

The present invention is made in view of the above, and an object thereof is to provide a female terminal and a continuity test device that enable a continuity test where the spring load of the elastic contact piece serving as the contact of the female terminal is not reduced without any complication of the structure of the continuity test device.

To solve the above-mentioned problem and attain the object, a female terminal according to the present invention includes a cylindrical part where a connection portion of a male terminal is inserted. The cylindrical part having a first inner surface, a second inner surface facing the first inner surface, a third inner surface and a fourth inner surface positioned between the first inner surface and the second inner surface and facing each other. The female terminal according to the present invention is provided with an elastic contact piece provided on the first inner surface of the cylindrical part so as to sandwich the connection portion between the elastic contact piece and the second inner surface; and a pair of continuity test contacts protruded on the third inner surface and the fourth inner surface so as to be brought into contact with a continuity test pin, and disposed at a position closer to an entrance side, in an insertion direction of the connection portion of the male terminal, of the cylindrical part than a contact with the connection portion and the elastic contact piece.

To solve the above-mentioned problem and attain the object, a continuity test device according to the present invention is provided with the continuity test pin brought into contact with the pair of continuity test contacts of the female terminal.

Moreover, the continuity test device according to the present invention is provided with, in the above-described invention, a detection pin configured to detect a state that the female terminal is inserted halfway in a connector housing. By inserting the detection pin in the connector housing in which the female terminal is accommodated together with the continuity test pin, when a spacer assembled to the connector housing in order to doubly lock the female terminal in the connector housing separately from a locking portion provided in the connector housing is in the middle of assembly because the female terminal is in a state of being inserted halfway in the connector housing, the detection pin abuts on the spacer to detect that the female terminal is inserted halfway in the connector housing.

Since the female terminal according to the present invention has the pair of continuity test contacts protruded so as to be brought into contact with the continuity test pin in the position closer to the entrance side, in the direction of insertion of the connection portion, of the cylindrical part than the contact of the elastic contact piece and on the inner surfaces of the cylindrical part facing in the direction orthogonal to the direction of sandwiching of the connection portion by the elastic contact piece, the continuity test can be performed by the continuity test pin with no contact by the elastic contact piece, and further, since the continuity test is performed by the continuity test pin with no contact by the elastic contact piece, it is unnecessary to add a special structure to the continuity test device, so that a continuity test can be performed that does not reduce the spring load of the elastic contact piece serving as the contact of the female terminal without any complication of the structure of the continuity test device.

Since the continuity test device according to the present invention has the continuity test pin brought into contact with the pair of continuity test contacts of the female terminal having the pair of continuity test contacts protruded so as to be brought into contact with the continuity test pin in the position closer to the entrance side, in the direction of insertion of the connection portion, of the cylindrical part than the contact of the elastic contact piece and on the inner surfaces of the cylindrical part facing in the direction orthogonal to the direction of sandwiching of the connection portion by the elastic contact piece, the continuity test can be performed by the continuity test pin with no contact by the elastic contact piece, and further, since the continuity test is performed by the continuity test pin with no contact by the elastic contact piece, it is unnecessary to add a special structure, so that a continuity test can be performed that does not reduce the spring load of the elastic contact piece serving as the contact of the female terminal without any complication of the structure of the continuity test device.

BRIEF DESCRIPTION OF THE DRAWINGS

FIGS. 1A to 1C show a female terminal according to an embodiment of the present invention.

DETAILED DESCRIPTION OF THE EXEMPLARY EMBODIMENTS

Hereinafter, a preferred embodiment of a female terminal and a continuity test device according to the present invention will be described in detail with reference to the drawings.

EMBODIMENT

Figure 1A:
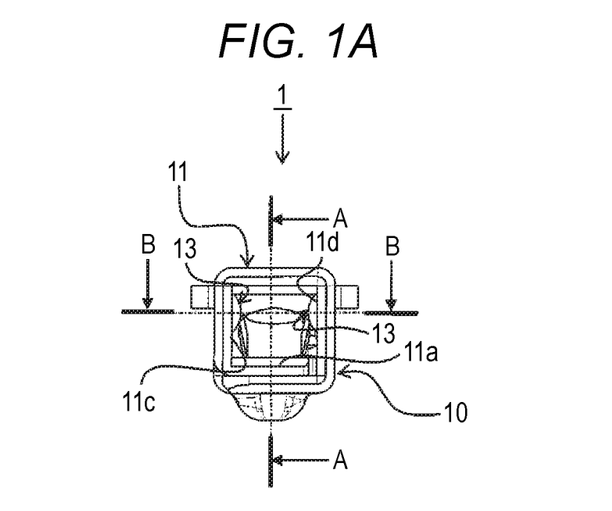
FIG. 1A is a view of the female terminal viewed from the entrance side in the insertion direction of a male terminal.
Figure 1B:
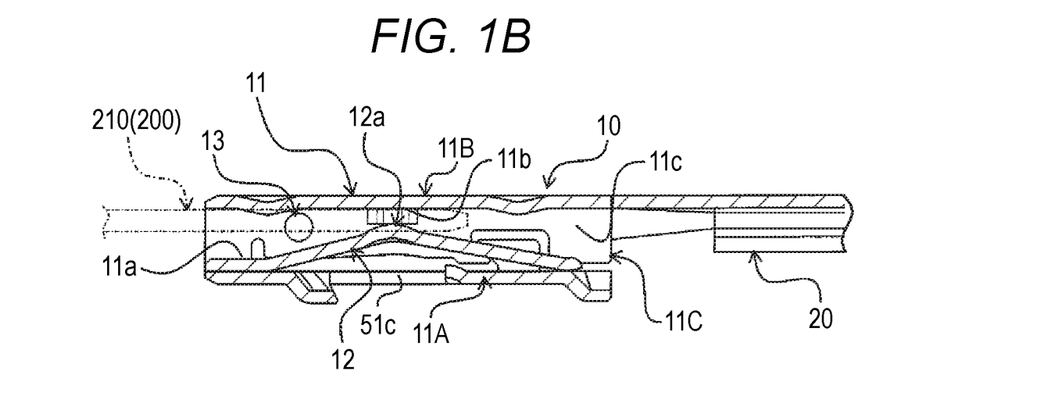
FIG. 1B is an A-A line cross-sectional view of the periphery of a cylindrical part of the female terminal shown in FIG. 1A.
Figure 1C:
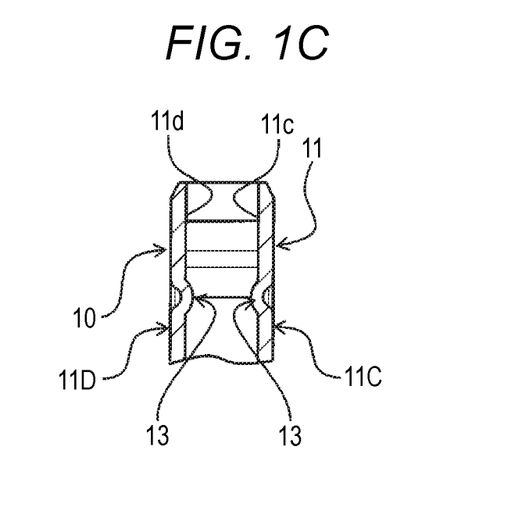
FIG. 1C is a B-B line cross-sectional view of the periphery of a pair of continuity test contacts of the female terminal shown in FIG. 1A.
Figure 2:
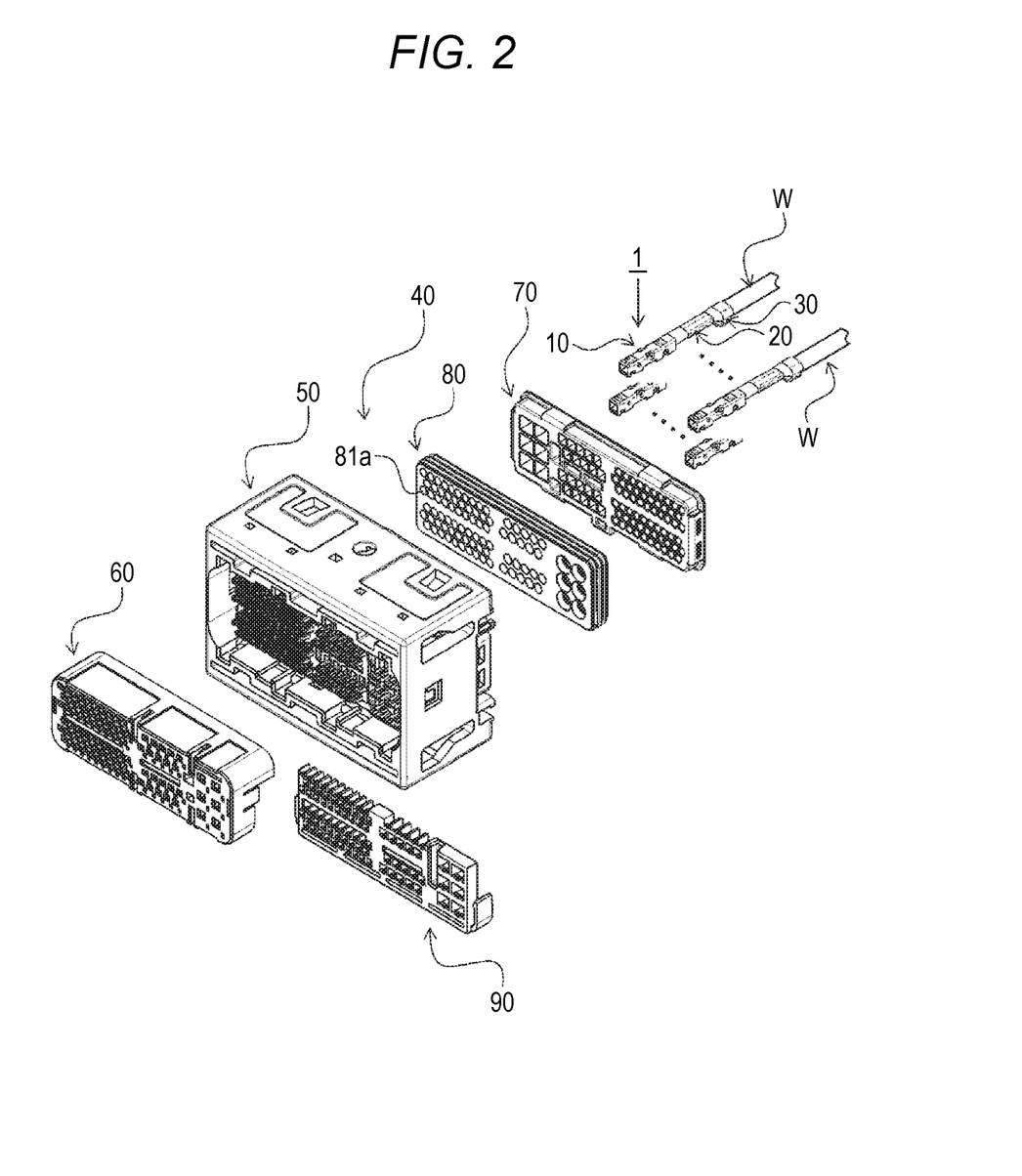
FIG. 2 is an exploded perspective view of a connector where the female terminal shown in FIGS. 1A to 1C is incorporated.
Figure 3A:
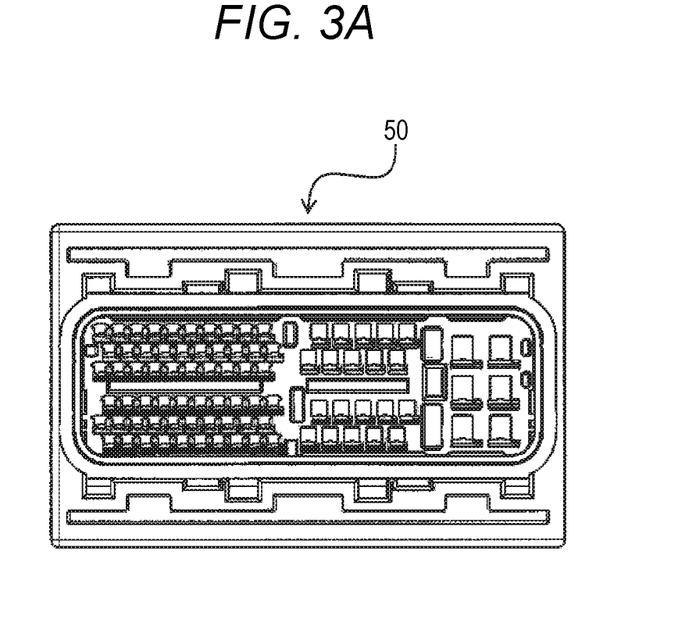
FIG. 3A is a front view of a connector housing.
Figure 3B:
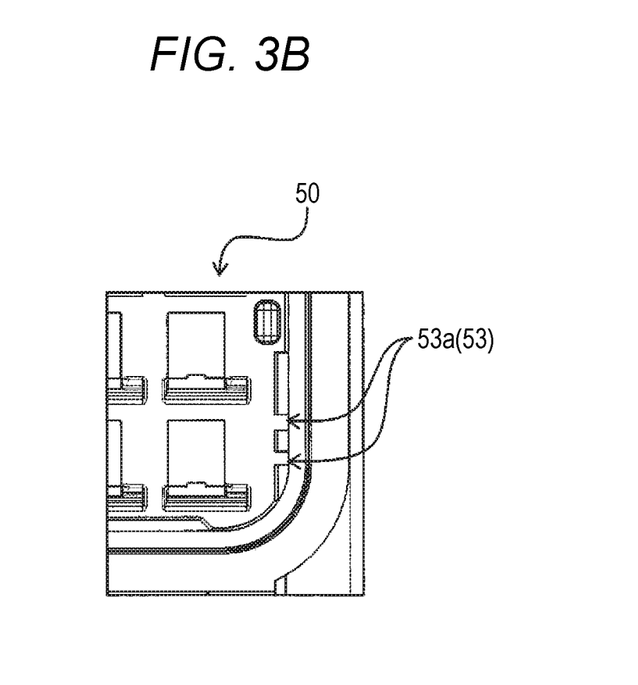
FIG. 3B is an enlarged view of the periphery of a spacer locking portion of the connector housing shown in FIG. 3A.
Figure 4A:
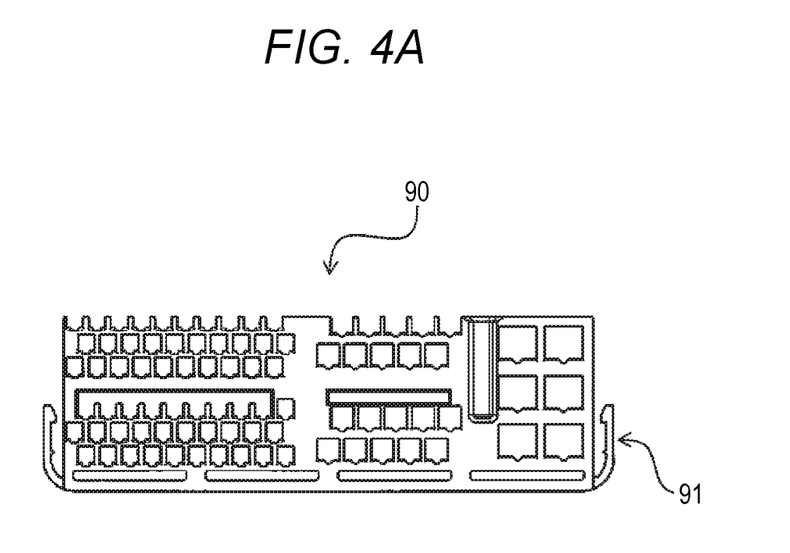
FIG. 4A is a front view of a spacer.
Figure 4B:
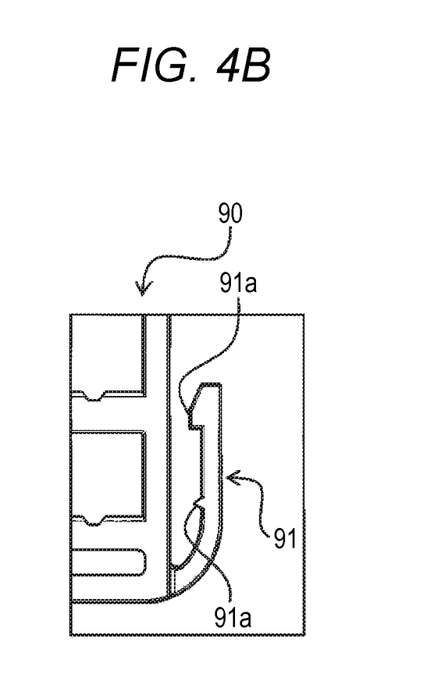
FIG. 4B is an enlarged view of the periphery of a spacer locked portion of the spacer shown in FIG. 4A.
Figure 5A:
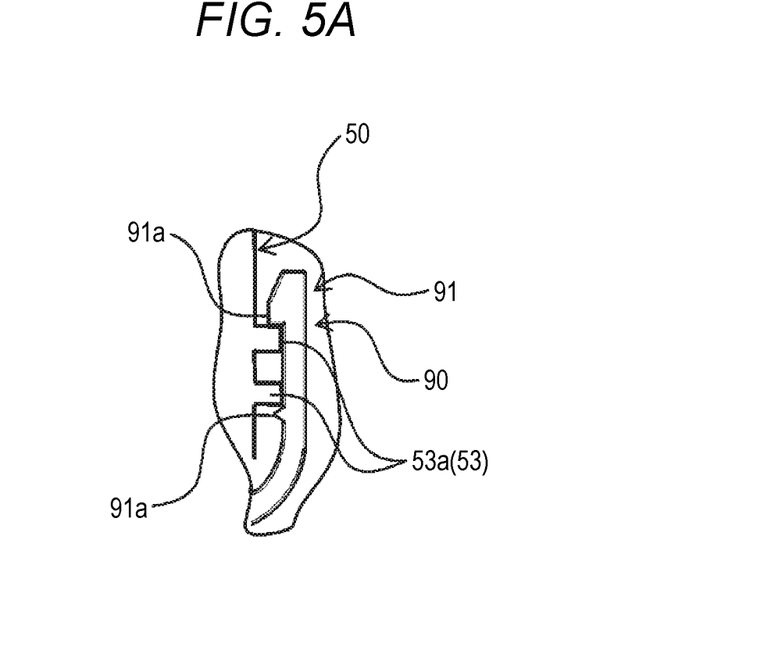
FIG. 5A is a view showing the condition of locking of the spacer locking portion and the spacer locked portion under a condition where the spacer is disposed in a temporary locking position.
Figure 5B:
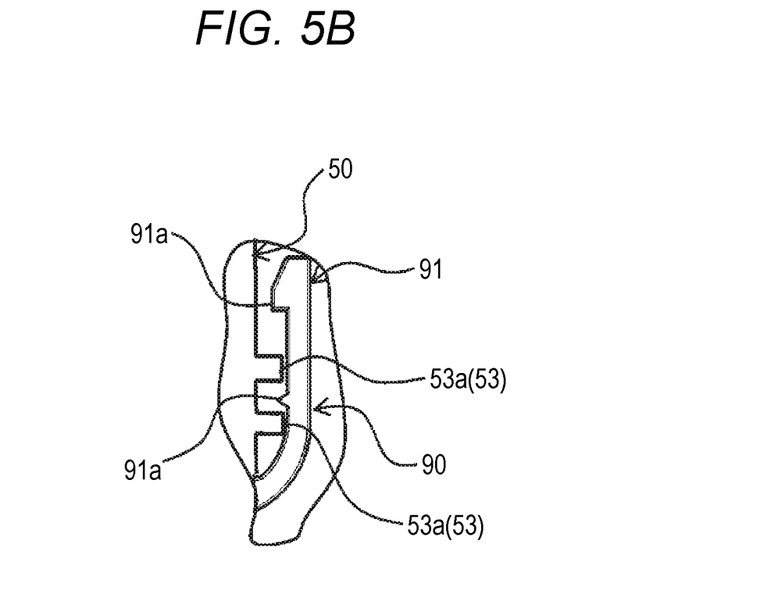
FIG. 5B is a view showing the condition of locking of the spacer locking portion and the spacer locked portion under a condition where the spacer is disposed in a permanent locking position.
Figure 6A:
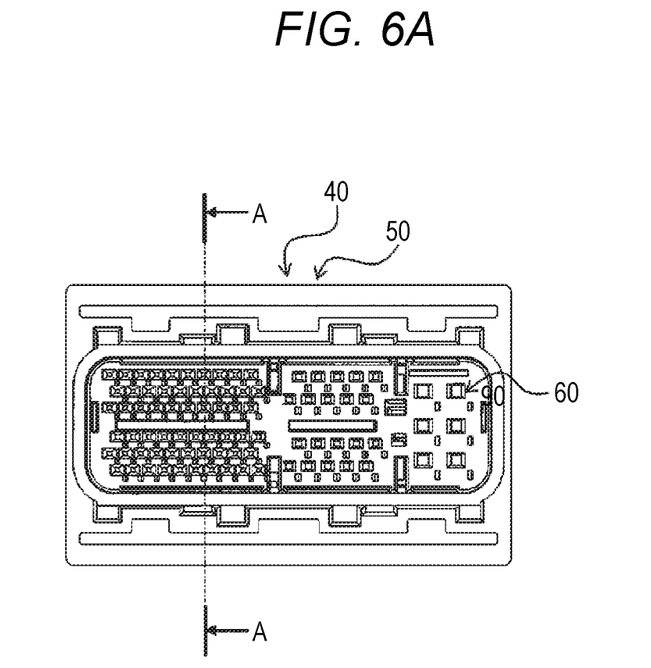
FIG. 6A is a front view of the connector.
Figure 6B:
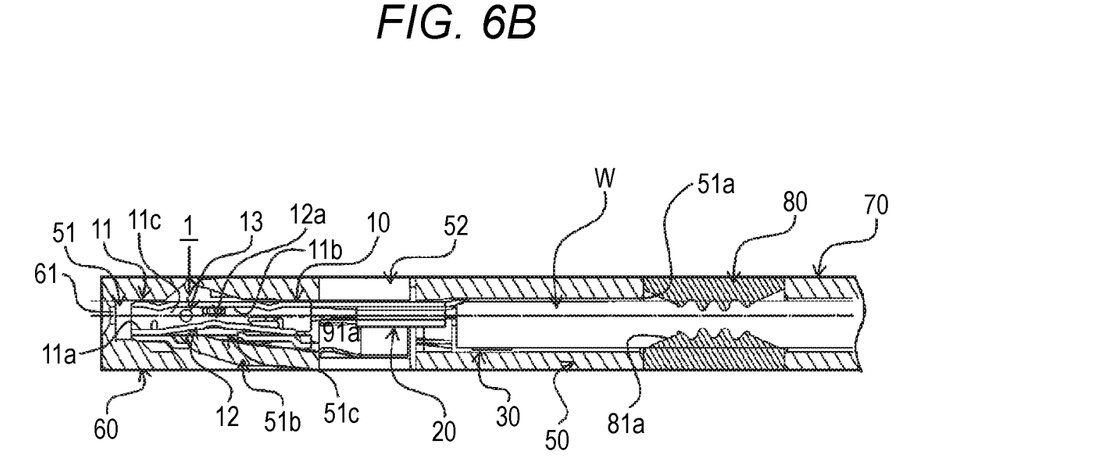
FIG. 6B is a cross-sectional view of the periphery of one terminal accommodating chamber when the connector shown in FIG. 6A is viewed on the A-A line cross section.
Figure 7:
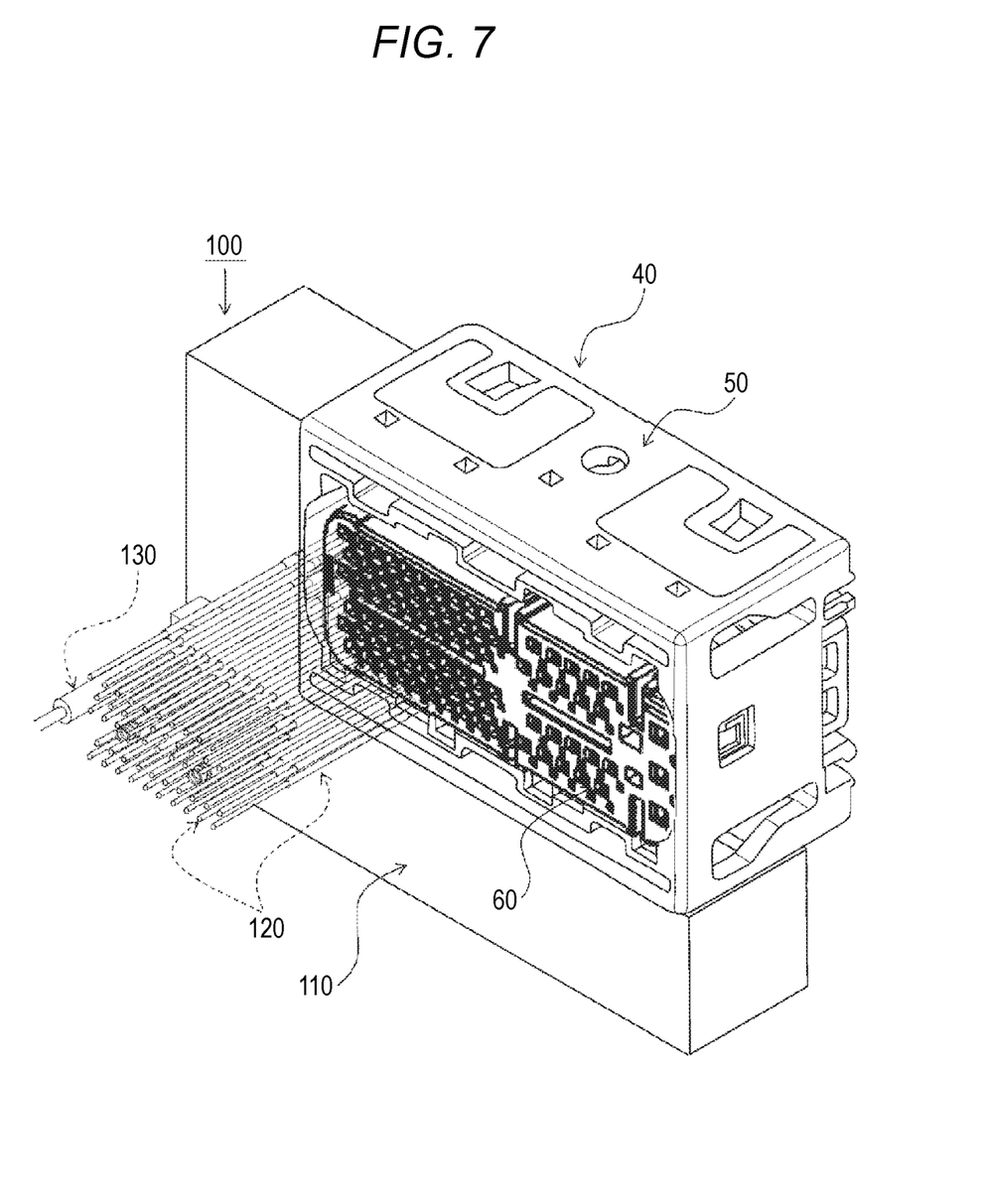
FIG. 7 is a view showing the continuity test of the connector being performed by the continuity test device and a view showing continuity test pins and a detection pin by broken lines.
Figure 8A:
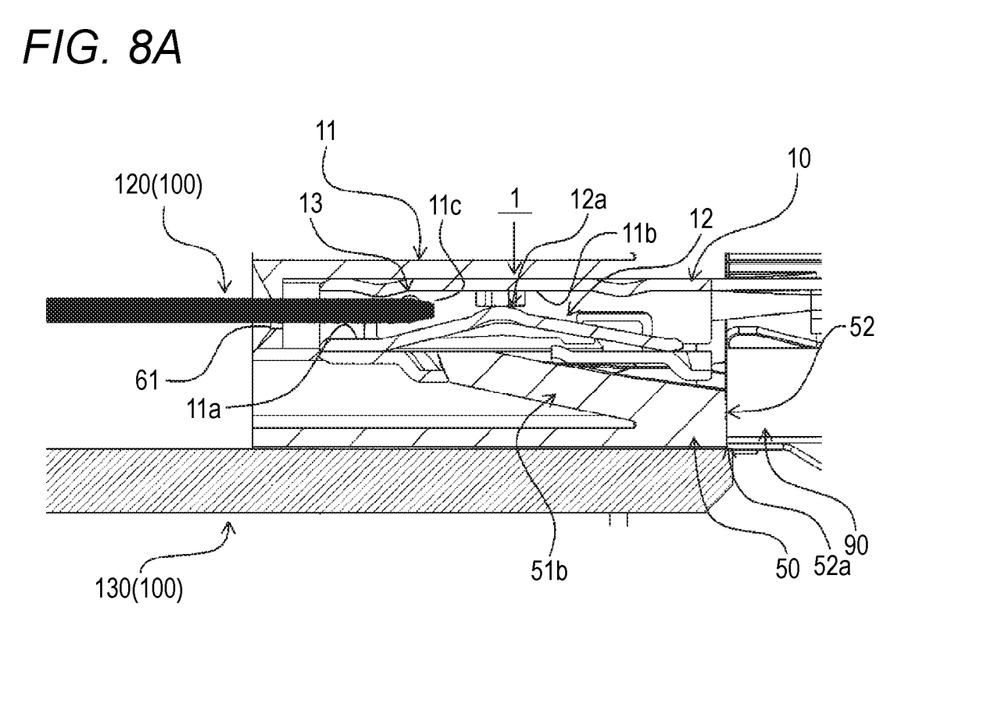
FIGS. 8A and 8B are views for explaining the displacement condition of the continuity test pins and the detection pin inserted in the connector housing with respect to the female terminal in a state of being completely inserted in the connector housing.
Figure 8B:
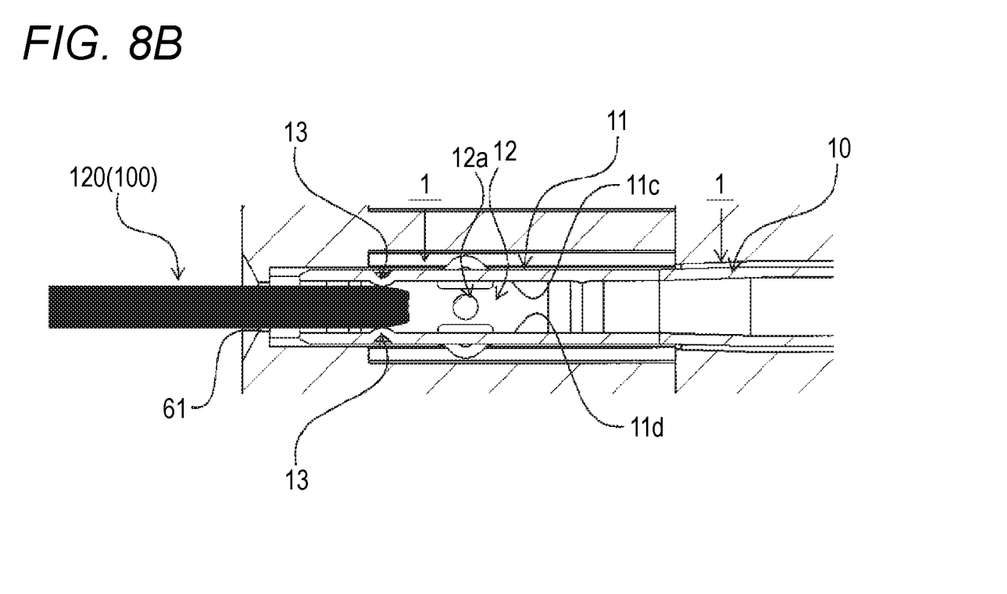
Figure 9A:
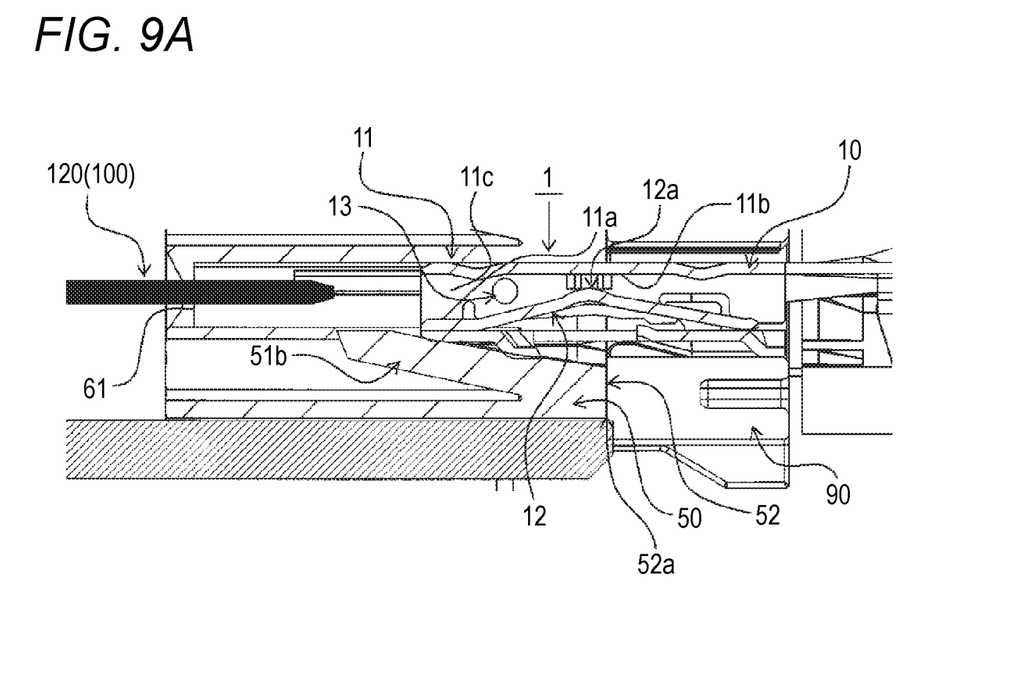
FIGS. 9A and 9B are views for explaining the displacement condition of the continuity test pins and the detection pin inserted in the connector housing with respect to the female terminal in a state of being inserted halfway in the connector housing.
Figure 9B:
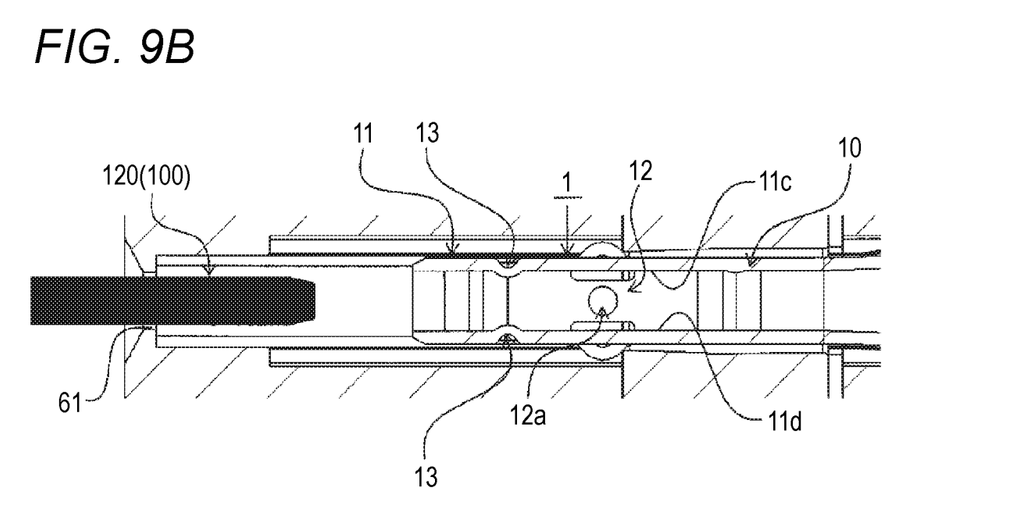

FIGS. 1A to 1C show a female terminal 1 according to the embodiment of the present invention; FIG. 1A is a view of the female terminal 1 viewed from the entrance side in the insertion direction of a male terminal, FIG. 1B is an A-A line cross-sectional view of the periphery of a cylindrical part 11 of the female terminal 1 shown in FIG. 1A, and FIG. 1C is a B-B line cross-sectional view of the periphery of a pair of continuity test contacts 13 of the female terminal 1 shown in FIG. 1A. FIG. 2 is an exploded perspective view of a connector 40 where the female terminal 1 shown in FIGS. 1A to 1C is incorporated. FIG. 3A is a front view of a connector housing 50, and FIG. 3B is an enlarged view of the periphery of a spacer locking portion 53 of the connector housing 50 shown in FIG. 3A. FIG. 4A is a front view of a spacer 90, and FIG. 4B is an enlarged view of the periphery of a spacer locked portion 91 of the spacer 90 shown in FIG. 4A. FIG. 5A is a view showing the condition of locking of the spacer locking portion 53 and the spacer locked portion 91 under a condition where the spacer 90 is disposed in a temporary locking position, and FIG. 5B is a view showing the condition of locking of the spacer locking portion 53 and the spacer locked portion 91 under a condition where the spacer 90 is disposed in a permanent locking position. FIG. 6A is a front view of the connector 40, and FIG. 6B is a cross-sectional view of the periphery of one terminal accommodating chamber 51 when the connector 40 shown in FIG. 6A is viewed on the A-A line cross section. FIG. 7 is a view showing the continuity test of the connector 40 being performed by the continuity test device 100 and a view showing continuity test pins 120 and a detection pin 130 by broken lines. FIGS. 8A and 8B are views for explaining the displacement condition of the continuity test pins 120 and the detection pin 130 inserted in the connector housing 50 with respect to the female terminal 1 in a state of being completely inserted in the connector housing 50. FIGS. 9A and 9B are views for explaining the displacement condition of the continuity test pins 120 and the detection pin 130 inserted in the connector housing 50 with respect to the female terminal 1 in a state of being inserted halfway in the connector housing 50.

In FIG. 1, the connection portion of the male terminal inserted in the cylindrical part is shown by a virtual line.

The female terminal 1 according to the embodiment of the present invention is connected to the male terminal by a contact 12a of an elastic contact piece 12 provided on an inner surface 11a of the cylindrical part 11 where a connection portion 210 of the male terminal 200 is inserted, so as to sandwich the connection portion 210 between the elastic contact piece 12 and an inner surface 11b facing the inner surface 11a.

Moreover, the continuity test device 100 according to the embodiment of the present invention performs the continuity test of the female terminal 1 accommodated in the connector housing 50 by the continuity test pins 120 and detects by the detection pin 130 that the female terminal 1 is inserted halfway in the connector housing.

First, the connector 40 where the female terminal 1 is incorporated will be described.

The connector 40 has: the connector housing 50 where the female terminal 1 is accommodated; a front holder 60 assembled to the end portion, on the side of fitting with a non-illustrated counterpart connector, of the connector housing 50; a rear holder 70 assembled to the end portion on the electric wire draw-out side of the connector housing 50; an elastic sealing member 80 held by the rear holder 70 so as to be sandwiched between the rear holder 70 and the connector housing 50; and the spacer 90 assembled to the connector housing 50 separately from the connector housing 50 in order to doubly lock the female terminal 1 in the connector housing 50 separately from a locking portion provided in the connector housing 50.

The connector housing 50 has a block shape, and made of an insulating resin material. The connector housing 50 includes: a plurality of terminal accommodating chambers 51 where a plurality of female terminals 1 are accommodated; a spacer insertion portion 52 which is a space where the spacer 90 is inserted in the connector housing 50; and the spacer locking portion 53 that locks the spacer 90 in the temporary locking portion and in the permanent locking position.

As shown in FIG. 6B, the end portion of the terminal accommodating chamber 51 on the side where the rear holder 70 is assembled serves as an insertion opening 51a of the female terminal so that an electric wire W is drawn out.

Moreover, the terminal accommodating chamber 51 is designed so that its end portion on the side of fitting with a counterpart connector is defined by the front holder 60 and a counterpart terminal insertion opening 61 where the connection portion 210 of the male terminal 200 of the counterpart connector is inserted is formed.

Moreover, an elastic locking piece 51b as the locking portion that locks the female terminal 1 in the position of completion of insertion in the terminal accommodating chamber 51 is provided in the terminal accommodating chamber 51.

The spacer insertion portion 52 forms a space connecting from a spacer insertion opening 52a (see FIG. 8A and FIG. 9A) into the connector housing 50 in a direction crossing the terminal accommodating chamber 51.

As shown in FIGS. 3A and 3B and FIGS. 5A and 5B, the spacer locking portion 53 is protruded at a distance in the direction of insertion of the spacer 90 at each end portion of the connector housing 50, and has two locking protrusions 53a that engage with later-described two locked protrusions 91a of the spacer 90.

The front holder 60 is made of an insulative resin material, and defines the terminal accommodating chamber 51 at the end portion on the side of fitting with the counterpart connector.

The rear holder 70 is made of an insulative resin material, and is assembled to the electric wire draw-out side end portion of the connector housing 50 so as to sandwich the elastic sealing member 80 between the rear holder 70 and the connector housing 50 in order to close, so as to be waterproof, the insertion opening 51a of the female terminal formed on the electric wire draw-out side end portion of the connector housing 50.

On the elastic sealing member 80 which is made of an elastic member such as a rubber material, a plurality of electric wire insertion holes 81a in which the electric wire W where the female terminal 1 is attached to the terminal portion is inserted are formed so as to correspond to the terminal accommodating chambers 51.

The spacer 90 is designed so as to be directed from the spacer insertion opening 52a of the connector housing 50 to the spacer insertion portion 52 to be incorporated in the connector housing 50.

This spacer 90 is made of an insulative resin material, and as shown in FIG. 4, a pair of locking arms 91 the ends of which extend in the direction of insertion into the connector housing 50 are provided at the lower ends of both side portions.

The locking arms 91 each have locked protrusions 91a protruding inward at two positions of the end and a position between the base and the end as spacer locked portions locked by the spacer locking portions 53 of the connector housing 50.

Under a condition where the spacer 90 is locked to the connector housing 50 in the temporary locking position, the spacer locking portions 53 of the connector housing 50 and the spacer locked portions 91 of the spacer 90 are locked as shown in FIG. 5A and are disposed in a position not interfering with the female terminal 1 from the insertion opening 51a of the female terminal to the position of completion of insertion into the terminal accommodating chamber 51.

Moreover, under a condition where the spacer 90 is locked to the connector housing 50 in the permanent locking position, the spacer locking portions 53 of the connector housing 50 and the spacer locked portions 91 of the spacer 90 are locked as shown in FIG. 5B.

Since the spacer 90 disposed in the permanent locked position is partly inserted in a position facing the rear end surface of the cylindrical part 11 in a position in the neighborhood of the rear end portion of the cylindrical part 11 of the female terminal 1 as shown in FIG. 8A, the female terminal 1 is inhibited from moving in a direction separated from the insertion opening 51a of the female terminal.

The spacer 90 is in a state of partly protruding from the spacer insertion opening 52a under a condition where it is not disposed in the permanent locking position.

For this reason, under a condition where the spacer 90 is not permanently locked to the connector housing 50 because the female terminal 1 is not inserted to the position of completion of insertion into the terminal accommodating chamber 51, the halfway inserted state of the female terminal 1 can be detected by the spacer 90 interfering with the counterpart connector.

Next, the female terminal 1 will be described.

The female terminal 1 is formed by performing punching and bending on a plate-like metallic member, and is attached to the terminal portion of the electric wire W as shown in FIG. 2 and FIG. 6B.

This female terminal 1 has: a counterpart terminal connection portion 10 serving as the portion connected to the male terminal of the counterpart connector; a conductor crimping portion 20 crimped to the conductor portion exposed by removing the insulating film of the electric wire W; and a film crimping portion 30 crimped to the insulating film of the electric wire W.

The counterpart terminal connection portion 10 has: the cylindrical part 11 where the connection portion of the male terminal is inserted; the elastic contact piece 12 provided on the inner surface 11a of the cylindrical part 11 so as to sandwich the connection portion 210 of the male terminal 200 between the elastic contact piece 12 and the inner surface 11b facing the inner surface 11a; and a pair of continuity test contacts 13 with which the continuity test pins 120 of the continuity test device 100 are brought into contact.

The cylindrical part 11 is rectangular in cross section, and two pairs of inner surfaces facing each other are formed.

In this cylindrical part 11, a locking hole 51c where the elastic locking piece 51b as the locking portion provided in the terminal accommodating chamber 51 is locked is formed on a wall 11A forming the inner surface 11a where the elastic contact piece 12 is provided.

The elastic contact piece 12 is bent into a mountain-like shape from one inner surface 11a of the cylindrical part 11 toward the inner surface 11b facing it, and serves as the contact 12a brought into contact with the connection portion 210 of the male terminal 200 by the vertex portion being protruded in a hemispherical shape.

The pair of continuity test contacts 13 are protruded on the inner surfaces 11c and 11d of the cylindrical part 11 facing in a direction orthogonal to the direction of sandwiching of the connection portion 210 by the elastic contact piece 12 so as to be brought into contact with the continuity test pins in a position closer to the entrance side, in the direction of insertion of the connection portion 210 of the male terminal 200, of the cylindrical part 11 than the contact 12a of the elastic contact piece 12.

More specifically, the continuity test contacts 13 are protruded in a hemispherical shape by embossing on a pair of walls 11C and 11D orthogonal to the wall 11A of the cylindrical part 11 where the elastic contact piece 12 is provided, and the vertex portion zero-touches or wraps the continuity test pins 120.

Moreover, the pair of continuity test contacts 13 perform a positioning guide function of guiding the connection portion 210 so as to be positioned in a position where it is in contact with the contact 12a of the elastic contact piece 12 in a direction in which the pair of continuity test contacts 13 face each other when the connection portion 210 of the male terminal 200 is inserted in the cylindrical part 11.

The continuity test pins 120 can be made shorter and thicker than when they are brought into contact with the contact 12a of the elastic contact piece 12 since the continuity test is enabled by the continuity test pins 120 being brought into contact with the pair of continuity test contacts 13 in the position closer to the entrance side in the insertion direction than the contact 12a of the elastic contact piece 12 in the cylindrical part 11 of the female terminal 1.

Next, the continuity test device 100 according to the embodiment of the present invention will be described.

As shown in FIG. 7, the continuity test device 100 has: a connector holding portion 110 that holds the connector 40; the plurality of continuity test pins 120 corresponding to the plurality of female terminals 1 accommodated in the connector housing 50; and the detection pin 130 that detects that the female terminals 1 are inserted halfway in the connector housing 50.

The continuity test pins 120 are set so as to be shorter and thicker than when they are brought into contact with the contact 12a of the elastic contact piece 12 since the continuity test is enabled by the continuity test pins 120 being brought into contact with the pair of continuity test contacts 13 provided in the position closer to the entrance side, in the insertion direction of the connection portion 210, of the cylindrical part 11 than the contact 12a of the elastic contact piece 12.

The detection pin 130 is designed so as to be inserted in the connector housing 50 where the female terminals 1 are accommodated together with the continuity test pins 120.

For this reason, the detection pin 130 abuts on the spacer 90 so that it can be detected that the female terminals 1 are inserted halfway in the connector housing 50 when the spacer 90 is in the middle of assembly because the female terminals 1 are in a state of being inserted halfway in the connector housing 50.

Next, the procedures of the continuity test of the connector 40 by using the continuity test device 100 will be described while the operations of the portions are shown.

First, a procedure of assembling the connector 40 into a state of being set in the connector holding portion 110 of the continuity test device 100 will be described.

The worker inserts the spacer 90 from the spacer insertion opening 52a of the connector housing 50 into the spacer insertion portion 52 and locks it in the temporary locking position.

Under a condition where the spacer 90 is thus locked in the temporary locking position, the worker inserts the plurality of female terminals 1 up to the insertion completion positions of the terminal accommodating chambers 51.

The female terminals 1 disposed in the insertion completion positions of the terminal accommodating chambers 51 are locked in the terminal accommodating chambers 51 by the elastic locking pieces 51b.

After the insertion of all the female terminals 1 into the corresponding terminal accommodating chambers 51 is completed, the worker disposes the spacer 90 in the permanent locking position.

When the spacer 90 is thus disposed in the permanent locking position, the connector 40 is in a state of being capable of fitting with the counterpart connector, and the test by the continuity test device 100 is executed.

In the continuity test, first, the worker sets the connector 40 on the connector holding portion 110. After the connector 40 is set on the connector holding portion 110, the plurality of continuity test pins 120 and the detection pin 130 are automatically or manually inserted into the connector housing 50. At this time, when all the female terminals 1 are disposed in the insertion completion positions of the corresponding terminal accommodating chambers 51, as shown in FIGS. 8A and 8B, the continuity test pins 120 are brought into contact with the pair of continuity test contacts 13 to thereby start the continuity test.

When all the female terminals 1 are disposed in the insertion completion positions of the corresponding terminal accommodating chambers 51, since the spacer 90 is disposed in the permanent locking position, as shown in FIG. 8A, the spacer 90 does not interfere with the detection pin 130.

On the other hand, when female terminals 1 inserted halfway in the terminal accommodating chambers 51 are present among the plurality of female terminals 1, as shown in FIGS. 9A and 9B, the continuity test pins 120 corresponding to the halfway inserted female terminals 1 are not in contact with the pair of continuity test contacts 13.

In such a case, by an error being notified by non-illustrated notification means of the continuity test device 100, it can be detected that the female terminals 1 are in a halfway inserted state.

Moreover, when female terminals 1 inserted halfway in the terminal accommodating chambers 51 are present among the plurality of female terminals 1, since the spacer 90 is not disposed in the permanent locking position, as shown in FIG. 9A, the spacer 90 interferes with the detection pin 130, so that it can be detected that the female terminals 1 are in a halfway inserted state.

Since the female terminal 1 according to the embodiment of the present invention has the pair of continuity test contacts 13 protruded so as to be brought into contact with the continuity test pins 120 in the position closer to the entrance side, in the direction of insertion of the connection portion 210, of the cylindrical part 11 than the contact 12a of the elastic contact piece 12 and on the inner surfaces 11c and 11d of the cylindrical part 11 facing in the direction orthogonal to the direction of sandwiching of the connection portion 210 by the elastic contact piece 12, the continuity test can be performed by the continuity test pins 120 with no contact by the elastic contact piece 12, and further, since the continuity test is performed by the continuity test pins 120 with no contact by the elastic contact piece 12, it is unnecessary to add a special structure to the continuity test device, so that a continuity test can be performed that does not reduce the spring load of the elastic contact piece 12 serving as the contact of the female terminal 1 without any complication of the structure of the continuity test device 100.

Since the continuity test device 100 according to the embodiment of the present invention has the continuity test pins 120 brought into contact with the pair of continuity test contacts 13 of the female terminal 1 having the pair of continuity test contacts 13 protruded in the position closer to the entrance side, in the direction of insertion of the connection portion 210, of the cylindrical part 11 than the contact 12a of the elastic contact piece 12 and on the inner surfaces 11c and 11d of the cylindrical part 11 facing in the direction orthogonal to the direction of sandwiching of the connection portion 210 by the elastic contact piece 12, the continuity test can be performed by the continuity test pins with no contact by the elastic contact piece, and further, since the continuity test is performed by the continuity test pins with no contact by the elastic contact piece, it is unnecessary to add a special structure, so that a continuity test can be performed that does not reduce the spring load of the elastic contact piece serving as the contact of the female terminal without any complication of the structure of the continuity test device.

Since the continuity test device 100 according to the embodiment of the present invention has the detection pin 130 that abuts on the spacer 90 to detect that the female terminal 1 is inserted halfway in the connector housing 50 when the spacer 90 assembled to the connector housing 50 separately from the connector housing 50 in order to doubly lock separately from the locking portion 51b provided in the connector housing 50 by being inserted in the connector housing 50 where the female terminal 1 is accommodated together with the continuity test pins 120 is in the middle of assembly because the female terminal 1 is in a state of being inserted halfway in the connector housing 50, it can be detected that the female terminal 1 is in a state of being inserted halfway in the connector housing 50 not only by the continuity test by the continuity test pins 120 but also by the detection pin 130.

While the invention made by the present inventor has been concretely described based on the above-described embodiment of the invention, the present invention is not limited to the above-described embodiment of the invention and various modifications are possible without departing from the gist thereof.

What is claimed is:

1. A female terminal comprising:
    a cylindrical part where a connection portion of a male terminal is inserted, the cylindrical part having a first inner surface, a second inner surface facing the first inner surface, a third inner surface and a fourth inner surface positioned between the first inner surface and the second inner surface and facing each other;

an elastic contact piece provided on the first inner surface of the cylindrical part so as to sandwich the connection portion between the elastic contact piece and the second inner surface; and a pair of continuity test contacts protruded on the third inner surface and the fourth inner surface so as to be brought into contact with a continuity test pin different from the male terminal, and disposed at a position closer to an entrance side of the cylindrical part, in an insertion direction of the connection portion of the male terminal, than a contact with the connection portion and the elastic contact piece, wherein the continuity test contacts are disposed in an area where the elastic contact piece is inclined upward from the entrance side of the cylindrical part toward the contact with the connection portion and the elastic contact piece.

2. A continuity test device comprising
    the continuity test pin brought into contact with the pair of continuity test contacts of the female terminal according to claim 1.

3. The continuity test device according to claim 2, further comprising
    a detection pin configured to detect a state that the female terminal is inserted halfway in a connector housing, wherein by inserting the detection pin in the connector housing where the female terminal is accommodated together with the continuity test pin, when a spacer assembled to the connector housing in order to lock the female terminal in the connector housing separately from a locking portion provided in the connector housing is in the middle of assembly because the female terminal is in a state of being inserted halfway in the connector housing, the detection pin abuts on the spacer to detect that the female terminal is inserted halfway in the connector housing.

* * * * *